United States Patent
Wu

(10) Patent No.: US 10,418,396 B1
(45) Date of Patent: Sep. 17, 2019

(54) STACKED IMAGE SENSOR PACKAGE

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/944,634

(22) Filed: Apr. 3, 2018

(51) Int. Cl.
*H01L 27/146* (2006.01)

(52) U.S. Cl.
CPC .. *H01L 27/14618* (2013.01); *H01L 27/14632* (2013.01); *H01L 27/14634* (2013.01); *H01L 27/14636* (2013.01); *H01L 27/14687* (2013.01); *H01L 27/1469* (2013.01)

(58) Field of Classification Search
CPC ......... H01L 27/14687; H01L 27/14636; H01L 27/1469; H01L 27/14618; H01L 27/14634
See application file for complete search history.

(56) References Cited

U.S. PATENT DOCUMENTS

| | | | |
|---|---|---|---|
| 7,663,231 B2* | 2/2010 | Chang | H01L 25/0657 257/724 |
| 7,759,751 B2* | 7/2010 | Ono | H01L 27/14618 257/432 |
| 8,791,536 B2* | 7/2014 | Kinsman | H01L 27/14618 257/432 |
| 2002/0096753 A1 | 7/2002 | Tu et al. | |
| 2015/0255500 A1* | 9/2015 | Akahoshi | H01L 27/14618 257/434 |
| 2016/0141280 A1 | 5/2016 | Lin et al. | |

* cited by examiner

*Primary Examiner* — David A Zarneke
(74) *Attorney, Agent, or Firm* — Adam R. Stephenson, Ltd.

(57) ABSTRACT

Implementations of semiconductor packages may include: an image sensor; an optically transmissive transparent coating directly coupled to the image sensor; and a glass lid coupled directly coupled to the optically transmissive coating. An entire surface of the glass may be directly coupled to an entire surface of the optically transmissive adhesive coating.

8 Claims, 11 Drawing Sheets

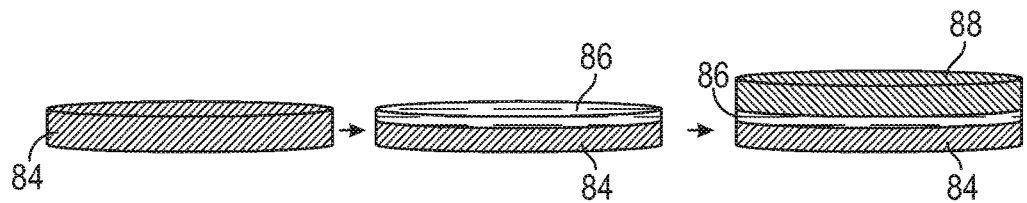
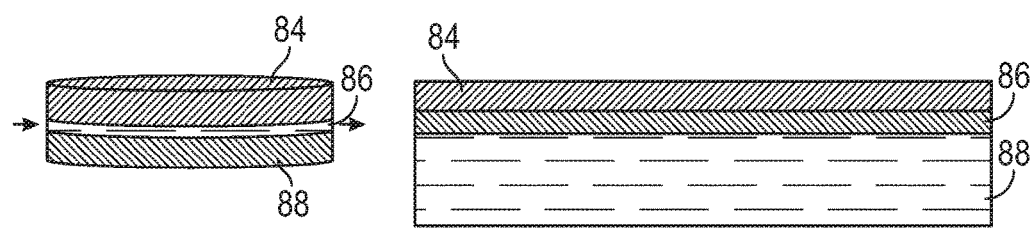
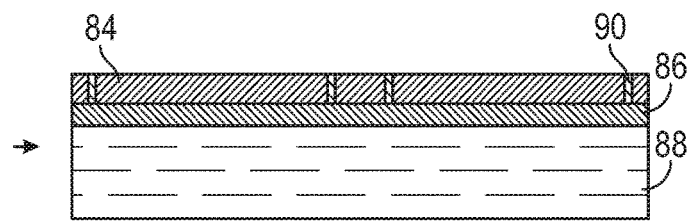
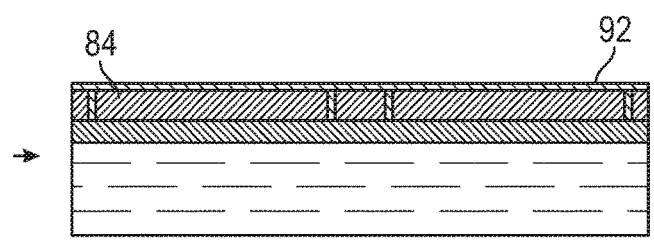
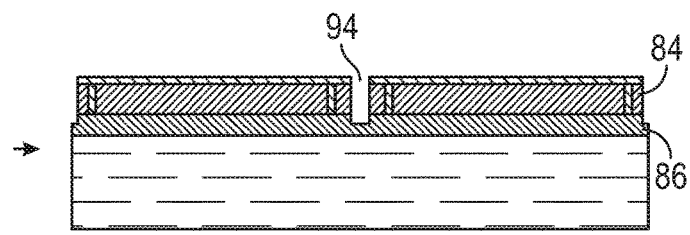

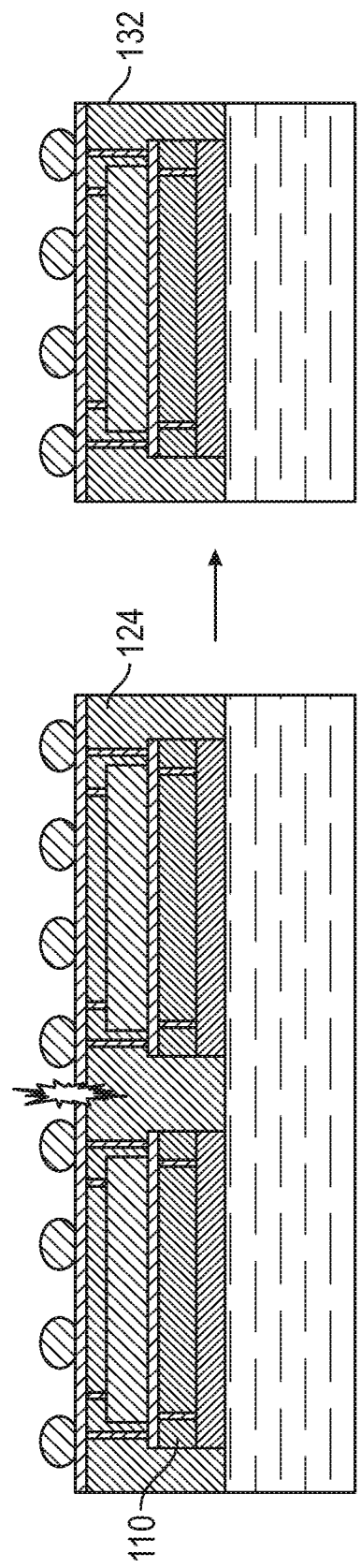

STACKED IMAGE SENSOR PACKAGE

BACKGROUND

1. Technical Field

Aspects of this document relate generally to semiconductor packages, such as image sensor chip scale packages. More specific implementations involve stacked image sensor packages.

2. Background

Conventionally, image sensor packages include a gap or space between the glass and the image sensor component of the package. Some image sensor packages use wire bonding between the various components.

SUMMARY

Implementations of semiconductor packages may include: an image sensor; an optically transmissive transparent coating directly coupled to the image sensor; and a glass lid coupled directly coupled to the optically transmissive coating. An entire surface of the glass may be directly coupled to an entire surface of the optically transmissive adhesive coating.

Implementations of semiconductor packages may include: an image sensor and a glass lid coupled to a first side of the image sensor through an optically transmissive coating. The package may also include a single redistribution layer (RDL) coupled to a second side of the image sensor. The package may also include a plurality of through vias (TV) included through the semiconductor package electrically coupling the components of the semiconductor package. The plurality of bumps may be coupled to the single RDL. The plurality of bumps may be coupled with the plurality of TV. The package may include no cavity between the glass lid and the image sensor due to the optically transmissive adhesive coating.

Implementations of semiconductor packages may include one, all, or any of the following:

The package may further include a first side of a second semiconductor die coupled to a second side of the single RDL, a mold compound around the second semiconductor die, and a second RDL coupled to a second side of the semiconductor die.

A mold compound may extend to the glass lid around one or more edges of the image sensor.

The package may further include a third die coupled to the second RDL and a third RDL coupled to a second side of the third die.

Implementations of a method of forming semiconductor packages may include: providing a semiconductor wafer comprising a plurality of image sensors and applying an optically transmissive adhesive coating to a first side of the semiconductor wafer. The method may also include coupling a glass wafer to the first side of the semiconductor wafer through the optically transmissive adhesive coating. The method may also include thinning the semiconductor wafer to a predetermined thickness. The method may also include forming a first plurality of through vias (TVs) in the semiconductor wafer. The method may also include forming a redistribution layer (RDL) on the second side of the semiconductor wafer and cutting between each of the plurality of image sensors into the optically transmissive adhesive coating to form a scribe line. The method may include coupling a second semiconductor die to the first RDL and coupling a molding compound over at least the second semiconductor die. The method may also include forming a second plurality of TVs extending from the first RDL to a second side of the molding compound extending from a second side of the second semiconductor die to the second side of the molding compound. The method may include forming a second redistribution layer (RDL) over the molding compound, coupling a plurality of bumps to the second RDL, and singulating a plurality of semiconductor packages at the scribe line.

Implementations of methods of forming semiconductor packages may include one, all, or any of the following:

Applying the optically transmissive adhesive coating may include applying one or more layers of the optically transmissive adhesive coating.

The glass wafer may be bare glass.

The glass wafer may be coated glass.

The second semiconductor die may include a passive device, an active device, an image sensor processor, a memory sensor, a sensor, or any combination thereof.

The second semiconductor die may have a width that is smaller than a width of the image sensor.

The plurality of bumps may include copper pillars or solder bumps.

A method for forming a semiconductor package may also include coupling a third semiconductor die to the second RDL layer and applying a third molding compound over the third semiconductor die. The method may also include forming a third set of TVs to electrically couple the third semiconductor die with the image sensor, the second semiconductor die, and a third RDL formed on the second side of the third semiconductor die.

Implementations of a method of forming semiconductor packages may include: providing a semiconductor wafer including a plurality of image sensors; singulating the plurality of image sensors; providing a glass wafer; applying an optically transmissive adhesive coating to a first side of the glass wafer; and coupling each of the plurality of image sensors to the optically transmissive adhesive coating comprised on the glass wafer. The method may also include applying a first molding compound around the plurality of image sensors surrounding at least three sides of the plurality of image sensors; thinning the plurality of image sensors and the molding compound; and forming a first plurality of through vias (TVs) through the plurality of image sensors. The method may also include forming a first redistribution layer on each of the plurality of image sensors; coupling a plurality of die to the plurality of image sensors; applying a second layer of molding compound over at least three sides of each of the plurality of die; forming a second plurality of through vias (TV) between the first redistribution layer and an edge of the second layer of molding compound between a second side of each of the plurality of die and the edge of the second layer of molding compound. The method may also include forming a second redistribution layer over the edge of the second layer of molding compound and coupling a plurality of balls to the second redistribution layer. The plurality of balls may be electrically coupled with the plurality of second die and the plurality of image sensors through the first plurality of TVs and through the second plurality of TVs. The method may also include singulating between each of the plurality of image sensors to form a plurality of semiconductor packages.

Implementations of methods of forming semiconductor packages may include one, all, or any of the following:

The method may include applying one or more layers of the optically transmissive adhesive coating.

The glass wafer may include bare glass or coated glass.

The second semiconductor die may include a passive device, an active device, an image sensor processor, a memory sensor, a sensor, or any combination thereof.

The second semiconductor die may have a width that is smaller than a width of the image sensor.

The plurality of bumps may include copper pillar or solder bumps.

The method may also include coupling a third semiconductor die to the second RDL layer; applying a third molding compound over the third semiconductor die; and forming a third set of through vias to electrically couple the third semiconductor die with the image sensor, the second semiconductor die, and a third redistribution layer formed on the second side of the third semiconductor die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor package, and implementing components and methods, consistent with the intended operation and methods.

Figure 1:
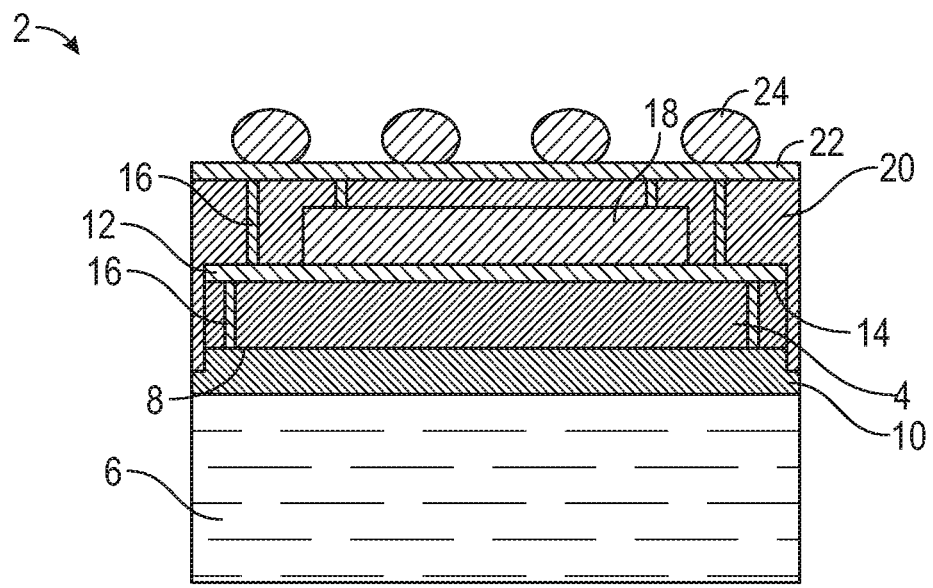
FIG. 1 is a cross sectional view of an implementation of a semiconductor package.

An implementation of a semiconductor device may include an image sensor having an optically transmissive adhesive coating directly coupled thereto. A glass lid is then directly coupled to the optically transmissive coating where the entire surface of the glass is directly coupled to the entire surface of the optically transmissive coating. This results in an image sensor package that does not have any cavity or space between the glass lid and the surface of the image sensor. Referring to FIG. 1, an implementation of a semiconductor package 2 having a stacked image sensor is illustrated. In this particular implementation, the package 2 includes an image sensor 4 coupled to a glass lid 6. The glass lid 6 is coupled to the first side 8 of the image sensor 4 through an optically transmissive adhesive coating 10. In various implementations, the optically transmissive adhesive coating may include a polymer material with a refractive index similar to glass. In some implementations, the refractive index of the optically transmissive adhesive coating may be about 1.5. The optically transmissive adhesive coating may have good optical transmission. After thermal process and reflow the optical transmission of various implementations of optically transmissive adhesive coating may be greater than 99%. By non-limiting example, the optically transmissive coating may be transparent or translucent. As illustrated in FIG. 1, there is no cavity or space between the glass lid 6 and the image sensor 4 due to the optically transmissive adhesive coating. This feature may prevent water and/or air from entering into the space between the image sensor and the glass lid and causing cracking/popcorning of the device. In various implementations, another material may be used in place of the glass lid such as, by non-limiting example, a translucent or transparent polymer, sapphire, tempered glass, or any other translucent or transparent material.

Referring again to FIG. 1, the semiconductor package 2 may also include a single redistribution layer (RDL) 12 coupled to a second side 14 of the image sensor 4. The components of the semiconductor package are electrically coupled through a plurality of through vias (TV) 16, which may be through silicon vias when passing through a silicon die rather than the other materials of the package. The TVs may include electrically conductive materials such as metal to allow for electrical connection between the components. A second semiconductor die 18 is coupled to a second side of the single RDL 12. While a second semiconductor die 18 is illustrated in this implementation and other implementations in this document, various package implementations may not include a second die, but just the image sensor.

The package also includes a molding compound 20 around the second semiconductor die 18. In this particular implementation the molding compound 20 extends along the sides of the package to a portion/layer of the optically transmissive coating 10. In other implementations, the molding compound may extend all the way to the glass lid encapsulating both the image sensor and the optically transmissive coating. In other implementations, the molding compound may only extend to a second side of a first RDL of the package. As illustrated in FIG. 1, the semiconductor package also includes a second RDL 22 coupled to a second side of the second semiconductor die 18 through the plurality of TV 16. A plurality of bumps 24 are coupled to the single RDL. The plurality of bumps 24 are electrically coupled with the plurality of TV 16 throughout the package.

Figure 2:
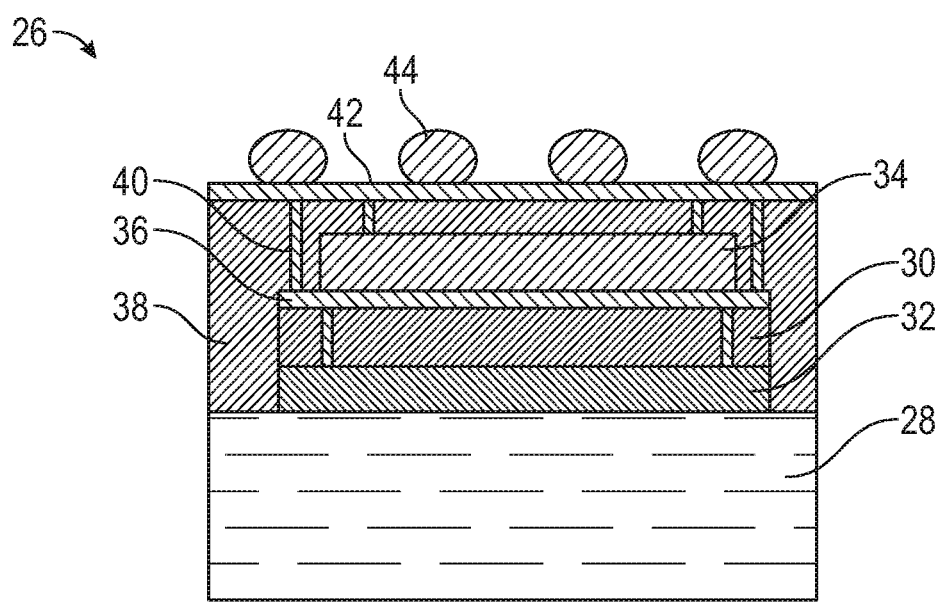
FIG. 2 is a cross sectional view of another implementation of a semiconductor package.

Referring to FIG. 2, another implementation of a semiconductor package 26 is illustrated. This semiconductor package 26 includes a second side of a glass lid 28 coupled with a first side of an image sensor 30 through an optically transmissive coating 32. The optically transmissive coating 32 may include one or more layers of coating materials. The package also includes a stacked chip 34 or second semiconductor die coupled to a first RDL 36. By non-limiting example, the stacked chip may be a passive device, an active device, an image sensor processor, a sensor including a memory sensor, or any combination thereof. In this implementation, a molding compound 38 encapsulates the stacked chip 34, the image sensor 30, and the optically translucent adhesive coating 32. A plurality of TV 40 are formed in the image sensor 30 and molding compound 38 in order to electrically couple the components of the device. A second RDL 42 is coupled to a second side of the molding compound 38 and a plurality of balls 44 are coupled to the second side of the second RDL 42. In various implementations, the semiconductor package may include a third die. The third die may be coupled to the second side of the second RDL and a third RDL may be coupled to a second side of the third die. In such an implementation, the plurality of bumps may be coupled to the second side of the third RDL and the plurality of TV may electrically couple all the components of the device.

Figure 3:
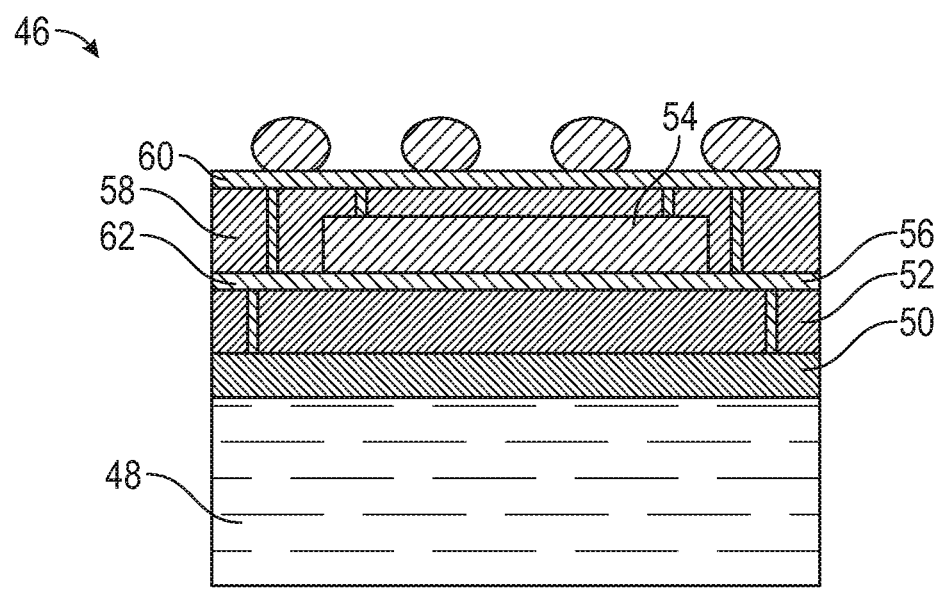
FIG. 3 is a cross sectional view of another implementation of a semiconductor package.

Referring to FIG. 3, another implementation of a semiconductor package 46 is illustrated. This implementation includes a glass lid 48 coupled directly to an optically transmissive adhesive coating 50. As previously described, the lid may be formed of various other transparent or translucent materials. The optically transmissive adhesive coating 50 is directly coupled to an image sensor 52. As illustrated the entire surface of the glass lid 48 is directly coupled to the entire surface of the optically transmissive coating 50 leaving substantially no space between the two surfaces. In various implementations, the glass lid may be coated glass or bare glass. In this implementation, a second semiconductor die 54 is coupled to a first RDL 56 on the second side of the image sensor 52. In this implementation, the second semiconductor die has a smaller width than the width of the image sensor. Because the width of the image sensor 52 is the same as the width of the glass lid 48, in this implementation, the molding compound 58 extends from the second RDL 60 to the first RDL 62 and does not extend to the glass 48 or optically transmissive adhesive coating 50. In other implementations, however, the second die may have the same width or a larger width than the image sensor.

Figure 4:
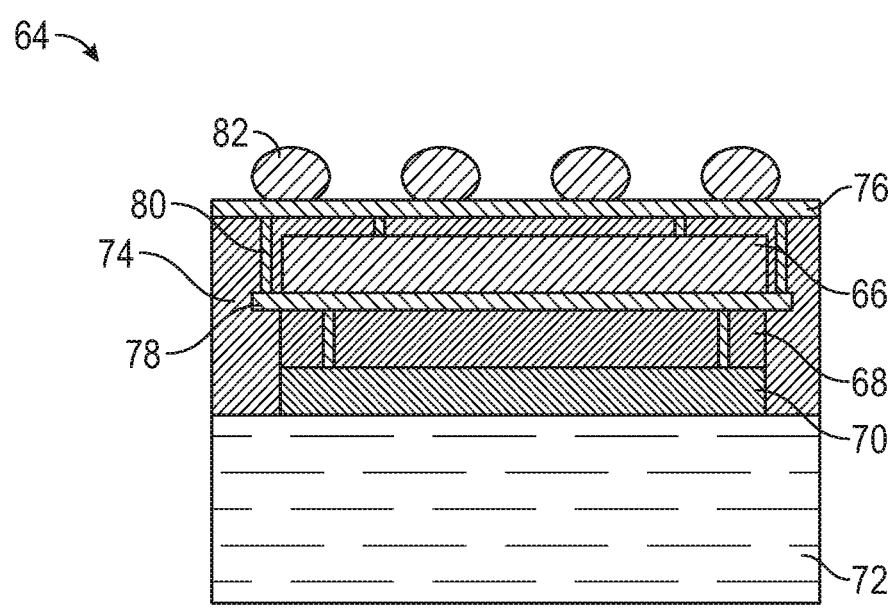
FIG. 4 is a cross sectional view of another implementation of a semiconductor package.

Referring to FIG. 4, another implementation of a semiconductor package 64 is illustrated. This implementation illustrates the second semiconductor die 66 having the same width as the image sensor 68 and the optically transmissive adhesive coating 70. The glass lid 72 extends past the width of these components. The molding compound 74 extends from the second RDL 76 to the glass lid 72 completely encapsulating the second semiconductor die 66, the image sensor 68, and the optically transmissive adhesive coating 70 on all sides. The molding compound covering the edges of the image sensor and second semiconductor die may act a light block and prevent moisture from entering the package to increase reliability of the device.

In this implementation, the first RDL 78 extends past the edges of the image sensor 68 and TVs 80 extend from the first RDL 78 to the second RDL 76 in order to electrically couple the image sensor 68 with the plurality of bumps 82 coupled to the second side of the second RDL 76. By non-limiting example, the plurality of bumps may include copper pillars, solder balls, and other electrical connector types (pads, etc.) used to couple a semiconductor package with a motherboard or other electrical device.

Figure 5I:
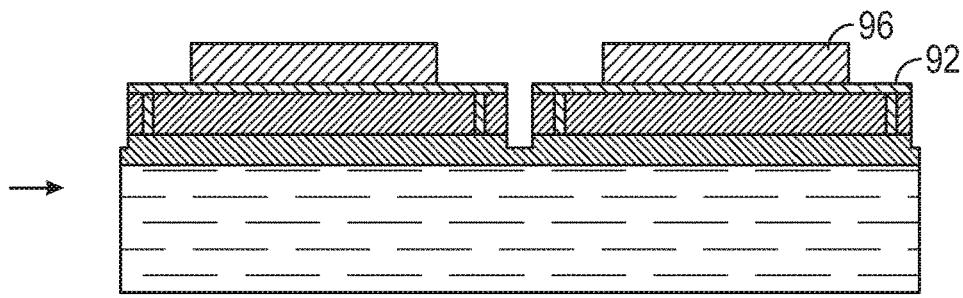
FIGS. 5A-5N is an implementation of a method of forming a semiconductor package as described herein.
Figure 5J:
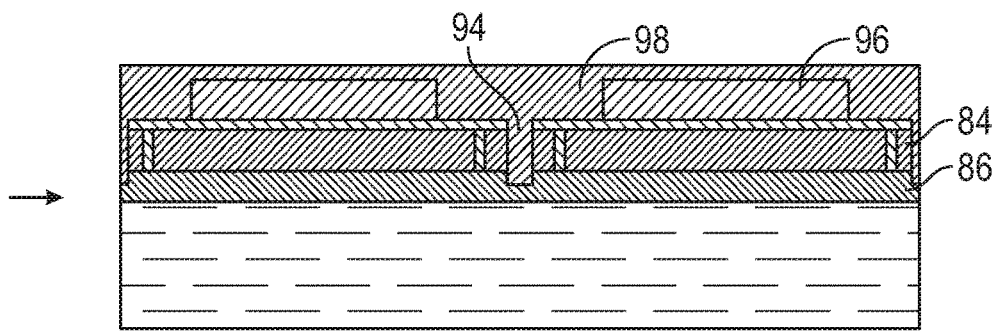
Figure 5K:
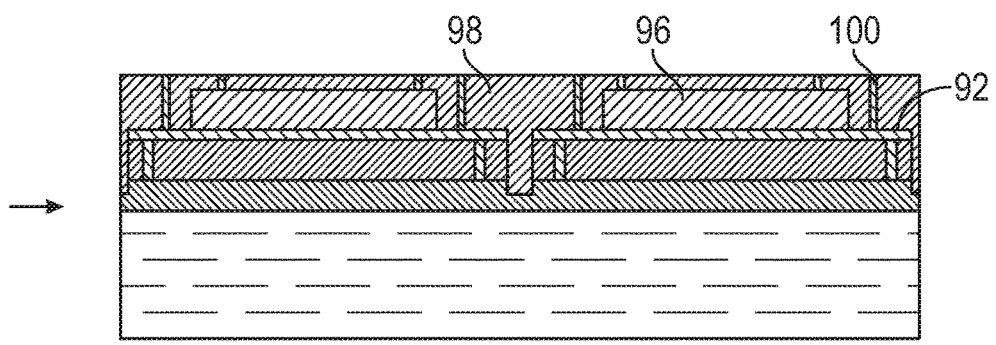
Figure 5L:
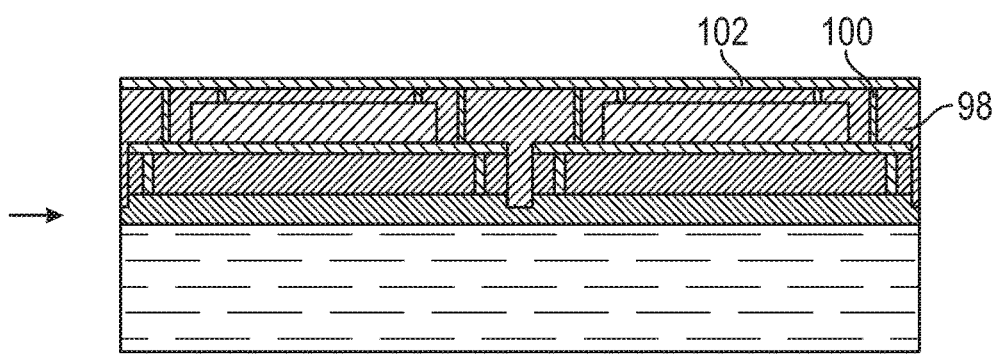
Figure 5M:
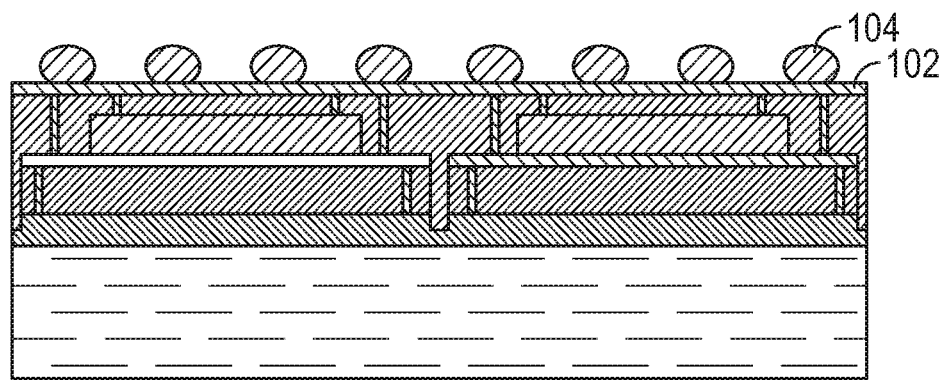
Figure 5N:
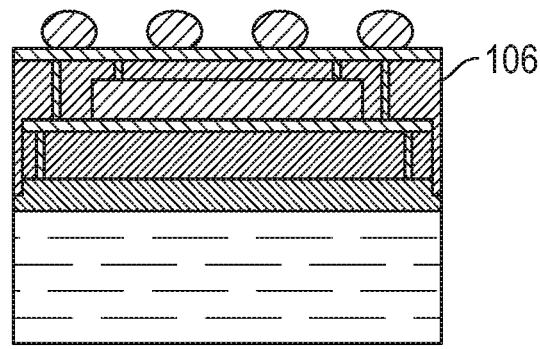

Referring to FIG. 5A-5N, a package at various stages of an implementation of a method for forming a semiconductor package is illustrated. Shown in FIG. 5A, the method includes providing a semiconductor wafer 84 including a plurality of image sensors. The semiconductor wafer may include silicon or may be made of any of a wide variety of other semiconductor substrate types, such as, by non-limiting example, silicon on insulator, gallium arsenide, silicon carbide, sapphire, ruby, or any other semiconductor substrate type. As illustrated in FIG. 5B, the method includes applying an optically transmissive adhesive coating 86 to a first side of the semiconductor wafer 84 over the image sensors formed thereon. In FIG. 5C, a glass wafer 88 is then coupled to the first side of the wafer 84 through and over the optically transmissive adhesive coating 86. Referring to FIG. 5D, the wafer 84 coupled to the glass lid 88 through the optically transmissive adhesive coating 86 is flipped for further processing. As illustrated in FIG. 5E, the backside of the wafer 84 is thinned. The wafer may be thinned through any suitable thinning method such as, by non-limiting example, mechanical grinding, chemical mechanical planarization (CMP), wet etching, and atmospheric downstream plasma dry chemical etching (ADP DCE).

Referring to FIG. 5F, the method further includes forming a first plurality of TVs 90 in the semiconductor wafer 84. The TVs may include metal for electrical connectivity, and since these TVs are formed through the silicon of the wafer, they are through silicon vias. As illustrated in FIG. 5G, the method includes forming a RDL 92 on the second side of the semiconductor wafer 84. The RDL may help with routing of signals throughout the package and device. The RDL may include dielectric materials as well formed of, by non-limiting example, polyimide, benzocyclobutene (BCB), other suitable polymers, or any other dielectric material. In various implementations, the RDL includes metal and may include metal traces to electrically couple with metal in TVs.

Referring to FIG. 5H, the method includes cutting between each of the plurality of image sensors 84 into the optically transmissive adhesive coating 86 to form a scribe line 94. By non-limiting example, the cutting may be performed through using sawing. As illustrated in FIG. 5I, the method includes coupling a second semiconductor die 96 to the first RDL 92. In various implementations, the second semiconductor die may include a passive device, an active device, an image sensor processor, a memory sensor, a sensor, or any combination thereof. Coupling may be done through any of a wide variety of die adhesion techniques, including, by non-limiting example, solder, chip adhesives, die attach film, electrically conductive materials, thermally conductive materials, epoxies, or any other material capable of adhering/coupling the die to the RDL material. As illustrated in FIG. 5J, the method includes coupling a molding compound over at least the second semiconductor die 96. In this particular implementation, the molding compound 98 extends into the scribe line 94 formed through cutting. The molding compound 98 also encapsulates the image sensors 84 and extends into the optically transmissive adhesive coating layer 86. In this way, the molding compound may protect the device from moisture and increase reliability of the device.

Referring to FIG. 5K, the method includes forming a second plurality of TV 100 in the molding compounding. The second plurality of TVs 100 extend from the first RDL 92 to a second side of the molding compound 98. The second plurality of TVs 100 also extend from a second side of the second semiconductor die 96 to the second side of the molding compound 98. The second plurality of TVs 100 electrically couple the components of the semiconductor package through a second redistribution layer 102 formed over the molding compound 98 as illustrated in FIG. 5L.

Referring to FIG. 5M, the method includes coupling a plurality of bumps 104 to the second RDL 102. The plurality of bumps may include solder bumps, copper pillars, and other electrical connector types, such as pads, etc. The plurality of bumps may electrically couple with the components of the device through the first plurality of TVs 90 and the second plurality of TVs 100. As illustrated in FIG. 5N, the method includes singulating a plurality of semiconductor packages 106 at the scribe lines. This may be done using sawing, water jet cutting, etching, or other singulation techniques. In various implementations, the method may include coupling a third semiconductor die to the second RDL (using any of the material types disclosed in this document) and applying a second molding compound over the third semiconductor die. The method may also include forming a third set of TVs to electrically couple the third semiconductor die with the image sensor, the second semiconductor die, and a third redistribution layer formed on the second side of the third semiconductor die.

Figure 6A:
FIGS. 6A-6N is an implementation of a method of forming a semiconductor package as described herein.
Figure 6B:
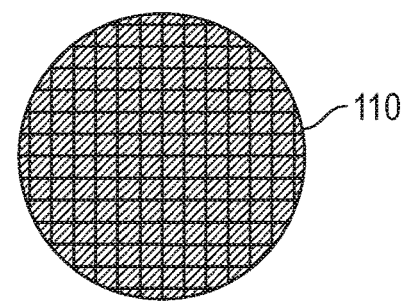
Figure 6C:
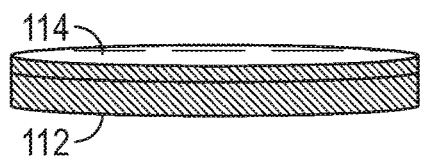

Referring to FIG. 6A-6N, a semiconductor package at various points in an implementation of a method for forming semiconductors as described herein is illustrated. Referring to FIG. 6A-6B, the method includes providing a semiconductor wafer 108 having a plurality of image sensors 110 and singulating the plurality of image sensors 110. The wafer may be any semiconductor substrate type disclosed in this document. Referring to FIG. 6C, the method includes providing a glass wafer 112 which may be coated glass or bare glass. In some implementations, the coated glass can have a single side coated or both sides coated. The coating material may provide protection to the glass from breaking or scratching. The coating material may also act as an anti-reflection barrier. The method further includes applying an optically transmissive adhesive coating 114 to a first side of the glass wafer 112. One or more layers of coating may be added between the plurality of image sensors and the glass wafer in various method implementations. The additional layers of coating may increase bonding between the plurality of image sensors and the glass wafer 112. The additional layers may also increase the optical function of the image sensors. In various implementations, a bonding process may be performed on the plurality of image sensors and the glass wafer after the optically transmissive adhesive coating 114 is applied.

Figure 6D:
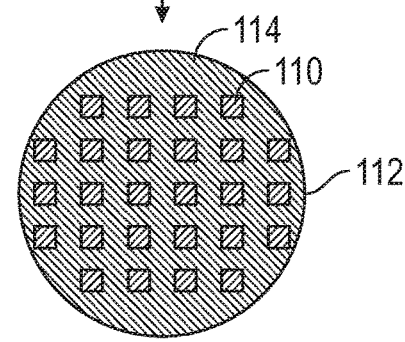
Figure 6E:
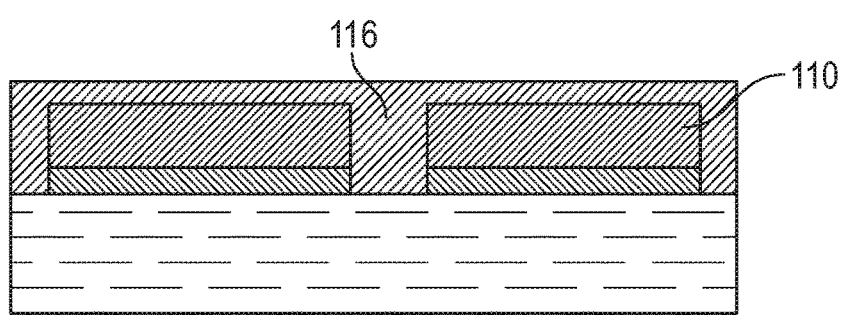
Figure 6F:
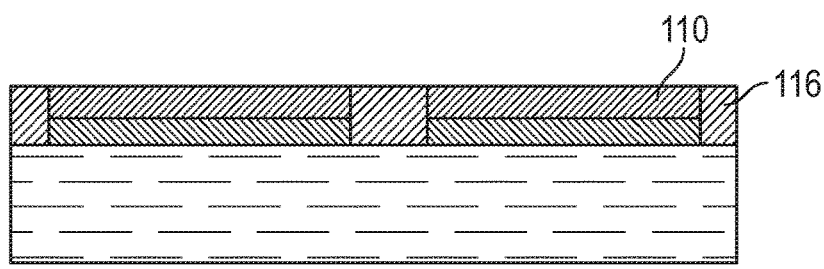

As illustrated in FIG. 6D, the method includes coupling each of the plurality of image sensors 110 to the optically transmissive adhesive coating 114 on the glass wafer 112. As illustrated in FIG. 6E, the method includes applying a first molding compound 116 around the plurality of image sensors 110 surrounding at least three sides of the plurality of image sensors. Referring to FIG. 6F, the method includes thinning the plurality of image sensors 110 and the molding compound 116. The wafer may be thinned through any suitable thinning method such as, by non-limiting example, mechanical grinding, chemical mechanical planarization (CMP), wet etching, and atmospheric downstream plasma dry chemical etching (ADP DCE). The plurality of image sensors may be thinned several tens of microns or up to about 100 microns in various implementations.

Figure 6G:
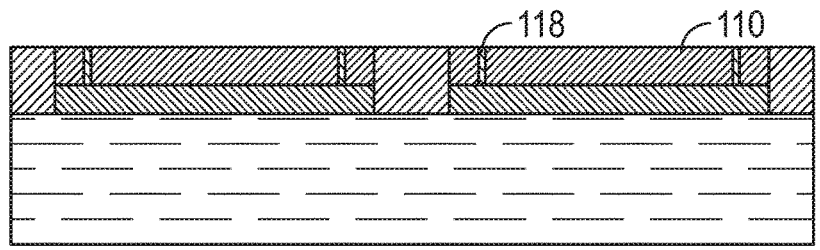
Figure 6H:
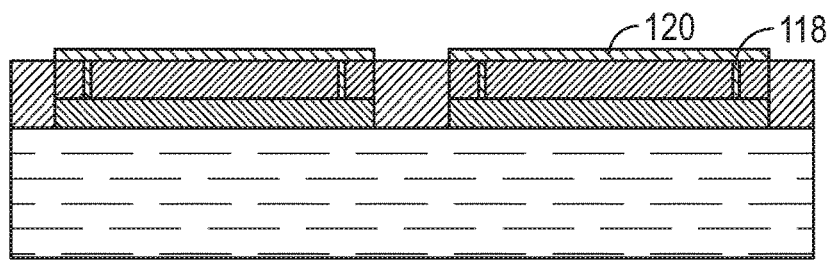

Referring to FIG. 6G, the method includes forming a first plurality of TVs 118 through the plurality of image sensors 110. The first plurality of TVs may be passivated/isolated from the silicon and may include layers of metal to improve interconnection between the components of the device (these are through silicon vias in this case). As illustrated in FIG. 6H, the method includes forming a first redistribution layer (RDL) 120 on each of the plurality of image sensors 110. The first RDL 120 may include solder mask, molding compound, or solder mask followed by molding compound or any of the other RDL materials disclosed in this document. The first RDL may have defined metal traces in various implementations and may electrically couple with the metal in the TVs.

Figure 6I:
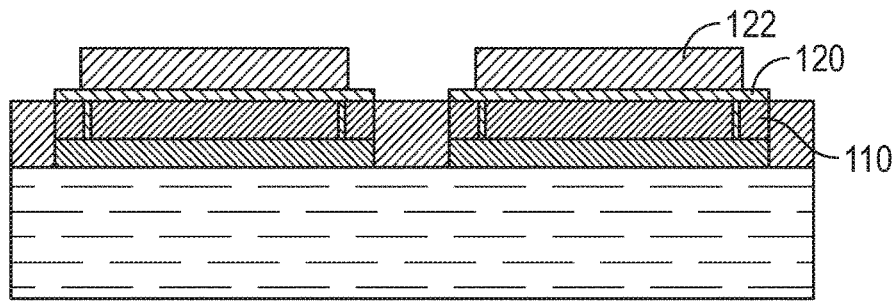

As shown in FIG. 6I, the method includes coupling a plurality of die 122 to the plurality of image sensors 110. A first side of the plurality of die 122 may be coupled to the second side of the plurality of image sensors 110 through/at the first RDL 120 using any of the die coupling materials disclosed in this document. Each of the plurality of die may be smaller, the same size, or larger than each of the plurality of image sensors. In various implementations, each of the plurality of die may be placed metal side facing away from the image sensor or metal side facing toward the image sensor.

Figure 6J:
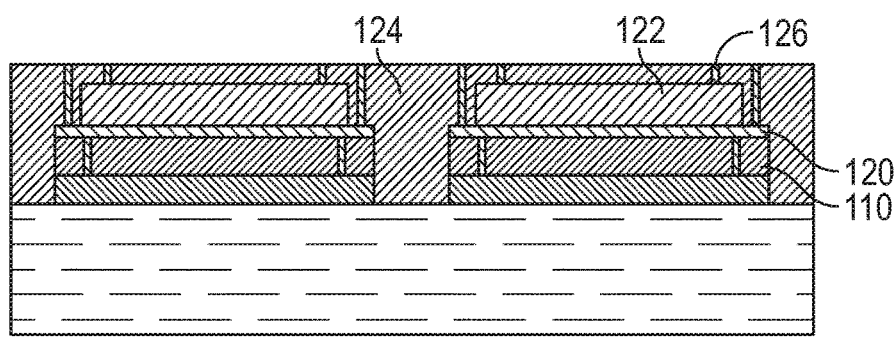

Referring to FIG. 6J, the method includes applying a second layer of molding compound 124 over at least three sides of each of the plurality of die 122. The method also includes forming a second plurality of through silicon vias (TV) 126 between the first RDL 120 and an edge of the second layer of molding compound 124. The second plurality of TV 126 may also be formed between the second side of each of the plurality of die 122 and the edge of the second layer of molding compound 124.

Figure 6K:
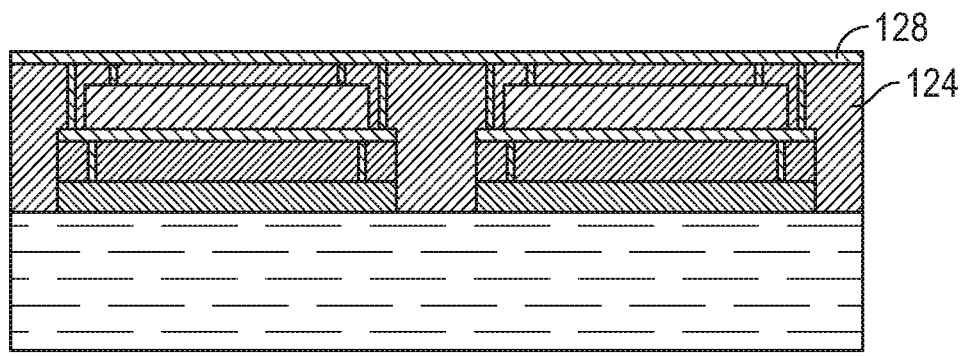
Figure 6L:
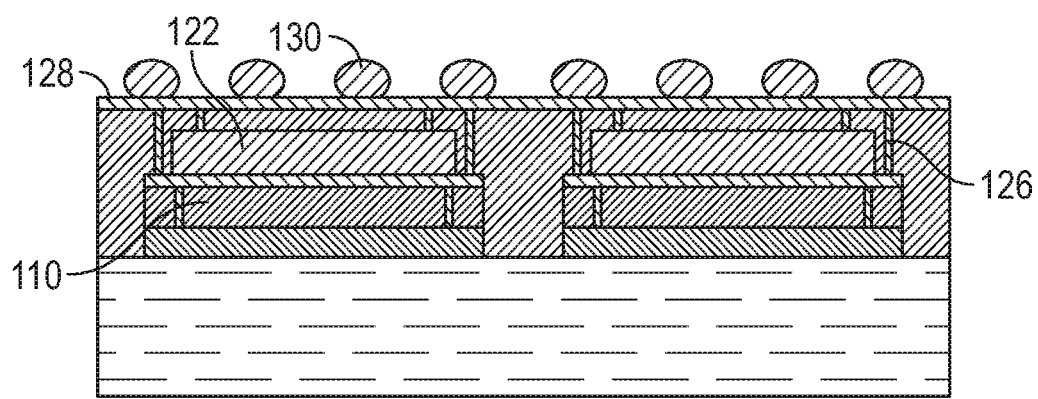

As shown in FIG. 6K, the method includes forming a second RDL 128 over the edge of the second layer of molding compound 124. The second RDL 128 may include any of the materials used in the first RDL 120. Referring to FIG. 6L, the method includes coupling a plurality of bumps 130 to the second redistribution layer 128. The plurality of bumps 130 are electrically coupled with the plurality of second die 122 and the plurality of image sensors 110 through the first plurality of TVs and through the second plurality of TVs 126. The plurality of bumps may include solder balls or copper bumps or any other electrical connector type disclosed in this document. The solder balls may be coupled to the second redistribution layer by ball drop or by solder paste. The solder balls may be lead free solder such as SAC305 manufactured by various companies such as American Iron and Metal of Montreal, Canada. The copper bumps or copper pillars may have solder caps. Referring to FIGS. 6M-6N, the method includes singulating between each of the plurality of image sensors 110 through the molding compound 124 to form a plurality of semiconductor packages 132. Singulating may be performed using sawing or any other singulation process disclosed herein.

As previously explained, in various implementations of a method of forming semiconductor packages, the method may further include coupling a third semiconductor die to the second RDL using any of the die bonding materials disclosed herein and applying a third molding compound over the third semiconductor die. The method may further include forming a third set of TVs to electrically couple the third semiconductor die with the image sensor, the second semiconductor die, and a third redistribution layer formed on the second side of the third semiconductor die. In other implementations, more than three chips/dies may be included in the package as required. An advantage of this method of forming semiconductor packages is having fewer vertical height limitations when compared with wire bonding connection methods.

Figure 7A:
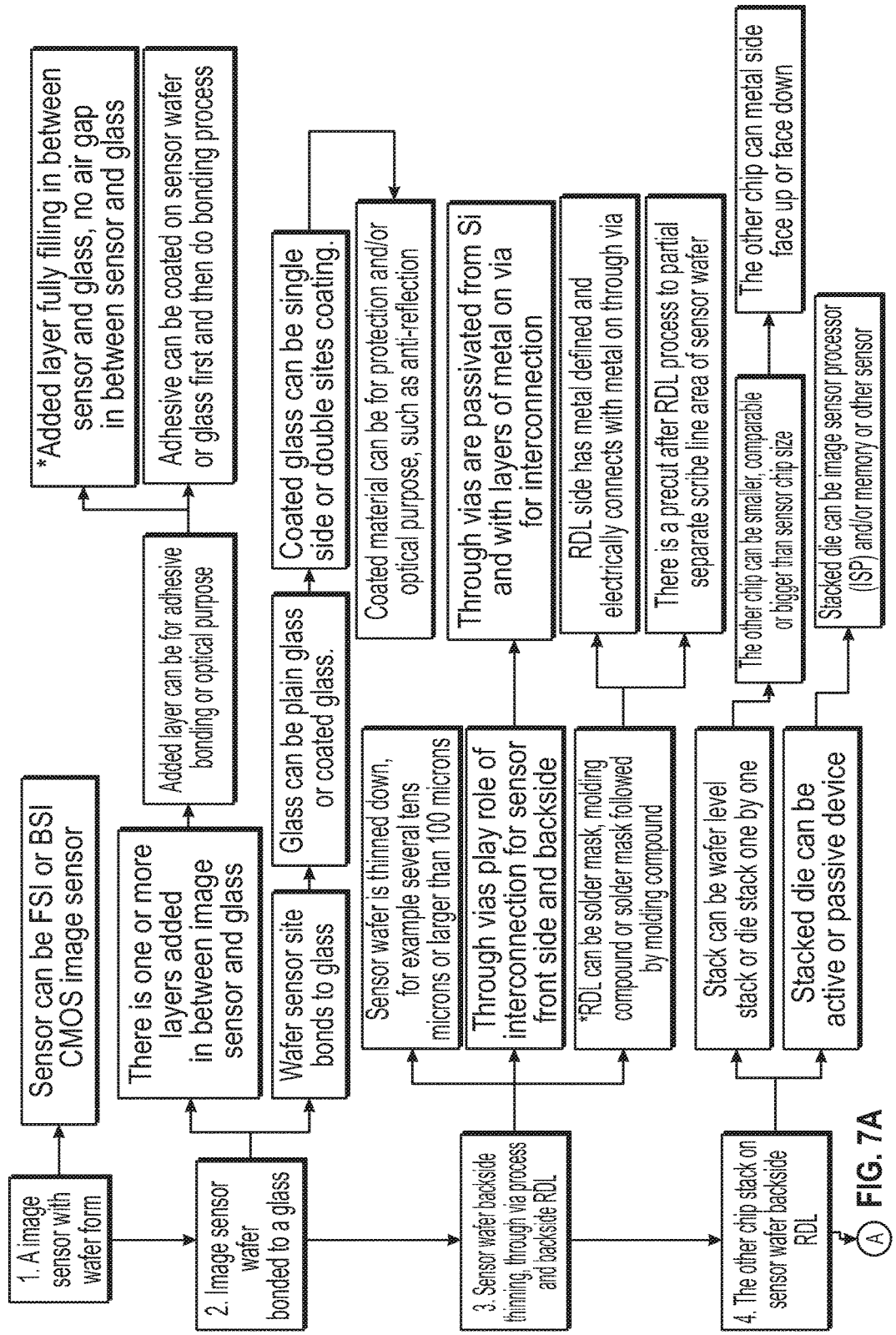
FIG. 7A-7B is a flow art of various implementations of semiconductor packages as described herein.
Figure 7B:
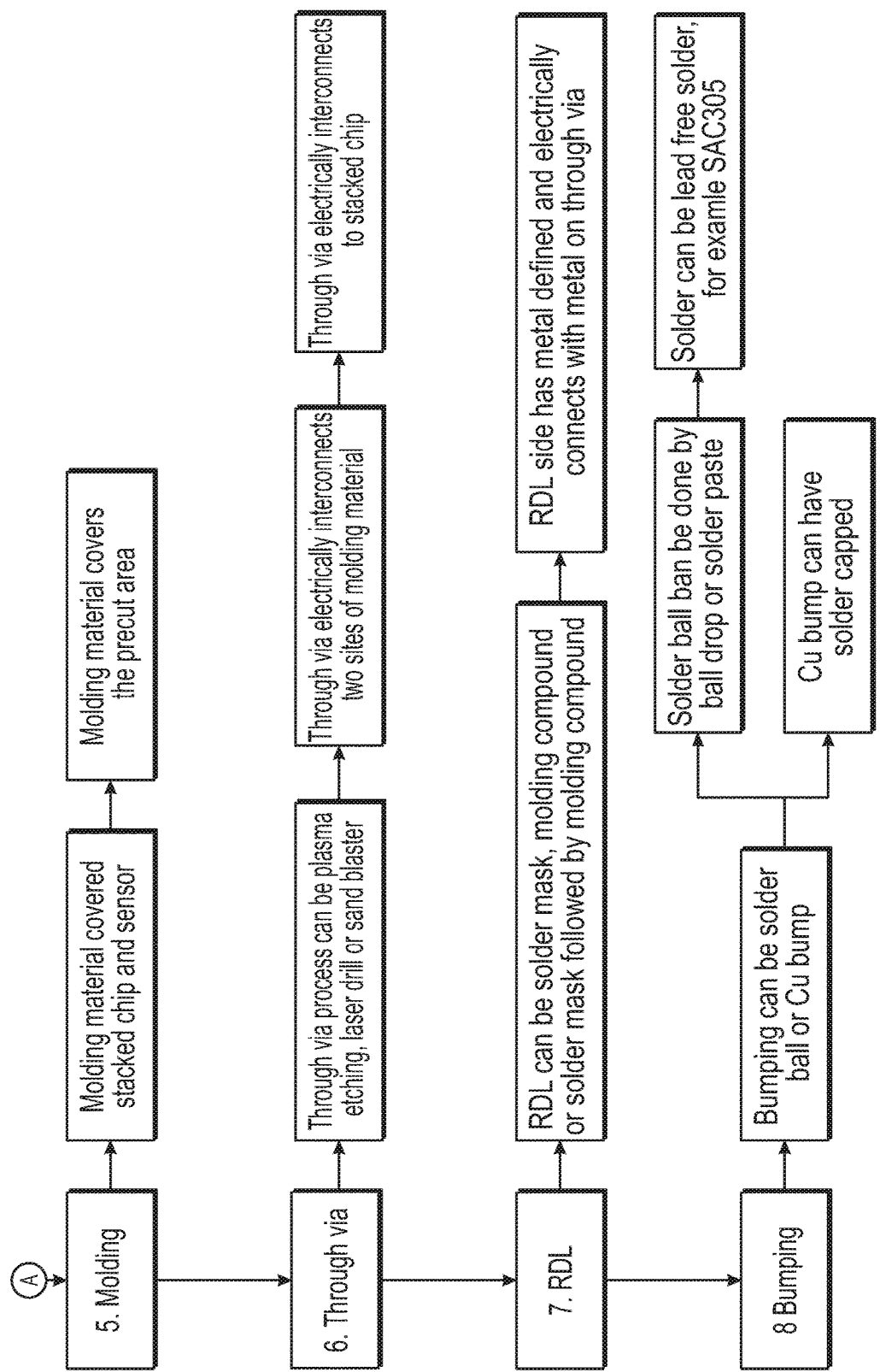

Referring to FIGS. 7A-7B, a structure tree is illustrated detailing various process options and combination that may be implemented at each step of the method depending on structural variations of the die, via, molding processes, electrical connectors, etc. that involve the various implementations of methods of forming semiconductor packages and various implementations of semiconductor packages as described herein. Any of these various process options can be employed in a wide variety of options in various implementations.

In places where the description above refers to particular implementations of semiconductors packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method for forming a semiconductor package, the method comprising:
    providing a semiconductor wafer comprising a plurality of image sensors;
    applying an optically transmissive adhesive coating to a first side of the semiconductor wafer;
    coupling a glass wafer to the first side of the semiconductor wafer through the optically transmissive adhesive coating;
    thinning the semiconductor wafer to a predetermined thickness;
    forming a first plurality of through vias (TVs) in the semiconductor wafer;
    forming a redistribution layer (RDL) on the second side of the semiconductor wafer;
    cutting between each of the plurality of image sensors into the optically transmissive adhesive coating to form a scribe line;
    coupling a second semiconductor die to the first RDL;
    coupling a molding compound over at least the second semiconductor die;
    forming a second plurality of TVs extending from the first RDL to a second side of the molding compound extending from a second side of the second semiconductor die to the second side of the molding compound;
    forming a second redistribution layer (RDL) over the molding compound;
    coupling a plurality of bumps to the second RDL; and
    singulating a plurality of semiconductor packages at the scribe line.

2. The method of claim 1, wherein applying the optically transmissive adhesive coating includes one or more layers of the optically transmissive adhesive coating.

3. The method of claim 1, wherein the glass layer is bare glass.

4. The method of claim 1, wherein the glass layer is coated glass.

5. The method of claim 1, wherein the second semiconductor die comprises one of a passive device, an active device, an image sensor processor, a memory sensor, a sensor, and any combination thereof.

6. The method of claim 1, wherein the second semiconductor die has a width that is smaller than a width of the image sensor.

7. The method of claim 1, wherein the plurality of bumps comprise one of copper pillar and solder bumps.

8. The method of claim 1, further comprising:
    coupling a third semiconductor die to the second RDL layer;
    applying a third molding compound over the third semiconductor die; and
    forming a third set of through vias to electrically couple the third semiconductor die with the image sensor, the second semiconductor die, and a third redistribution layer formed on the second side of the third semiconductor die.

* * * * *